(12) United States Patent
Kim (10) Patent No.: US 9,293,482 B2
(45) Date of Patent: Mar. 22, 2016

(54) THIN-FILM TRANSISTOR ARRAY SUBSTRATE, DISPLAY APPARATUS INCLUDING SAME, AND METHOD OF MANUFACTURING THIN-FILM TRANSISTOR ARRAY SUBSTRATE

(71) Applicant: SAMSUNG DISPLAY CO., LTD., Yongin, Gyeonggi-Do (KR)

(72) Inventor: Hyun-Tae Kim, Yongin (KR)

(73) Assignee: SAMSUNG DISLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/108,944

(22) Filed: Dec. 17, 2013

(65) Prior Publication Data

US 2015/0053931 A1     Feb. 26, 2015

(30) Foreign Application Priority Data

Aug. 21, 2013   (KR) .................. 10-2013-0099243

(51) Int. Cl.
  *H01L 27/12*   (2006.01)
  *H01L 27/32*   (2006.01)

(52) U.S. Cl.
  CPC .......... *H01L 27/124* (2013.01); *H01L 27/1259* (2013.01); *H01L 27/3276* (2013.01)

(58) Field of Classification Search
  CPC ............ H01L 29/7869; H01L 27/1225; H01L 29/66742; H01L 29/66969; H01L 21/02565; H01L 29/78693; H01L 21/02554; H01L 29/78696; H01L 27/1214; H01L 27/124; H01L 21/02631; H01L 29/4908; H01L 29/786; H01L 27/3276; H01L 27/1259
  USPC ............. 257/9, 20, 24, 27, 38, 40, 57, 61, 69, 257/124, 133, 134, 187, 192, 256, 259, 262, 257/272–274, 300–369, 390–401, 773, 257/E27.011, E27.015, E27.045, E27.048, 257/E27.054, E27.081, E27.09, E29.165, 257/E29.183, E29.189, E29.262, E29.247, 257/E29.275, E29.318–E29.32, E23.041, 257/201–211; 438/142, 169, 188, 195–201, 438/206, 209, 241, 258–279, 666, 438/149–159; 349/139–152
  See application file for complete search history.

(56) References Cited

U.S. PATENT DOCUMENTS 5,905,307 A * 5/1999 Onoda ................ H01L 23/5226
                                                            257/758
8,823,010 B2 * 9/2014 Kim et al. .................. 257/72

(Continued)

FOREIGN PATENT DOCUMENTS

| JP | 2000-357735 | 12/2000 |
|---|---|---|
| JP | 2002-176179 | 6/2002 |
| JP | 2007-201399 | 8/2007 |

*Primary Examiner* — Yasser A Abdelaziez
*Assistant Examiner* — Farun Lu
(74) *Attorney, Agent, or Firm* — F. Chau & Associates, LLC (57) ABSTRACT

A thin-film transistor (TFT) array substrate includes: a TFT including an active layer, a gate electrode, a source electrode, and a drain electrode; a first conductive layer disposed in a same layer as one of the active layer, the gate electrode, the source electrode, and the drain electrode; a second conductive layer disposed in a different layer from the first conductive layer; a node contact hole including a first contact hole part which exposes the first conductive layer, a second contact hole part which exposes the second conductive layer, and a connection part which connects the first contact hole part and the second contact hole part and has a width smaller than that of the first contact hole part and that of the second contact hole part; and a connection node disposed in the node contact hole to electrically connect the first and second conductive layers.

18 Claims, 10 Drawing Sheets

(56) References Cited

U.S. PATENT DOCUMENTS

2005/0259142 A1* 11/2005 Kwak ........................... 347/238
2006/0292865 A1 12/2006 Yamazaki et al.
2009/0078939 A1* 3/2009 Yamazaki ......... H01L 21/67144
 257/59

* cited by examiner

THIN-FILM TRANSISTOR ARRAY SUBSTRATE, DISPLAY APPARATUS INCLUDING SAME, AND METHOD OF MANUFACTURING THIN-FILM TRANSISTOR ARRAY SUBSTRATE

CROSS-REFERENCE TO RELATED APPLICATIONS

This application claims priority to Korean Patent Application No. 10-2013-0099243, filed on Aug. 21, 2013, in the Korean Intellectual Property Office, the disclosure of which is incorporated by reference in its entirety herein.

BACKGROUND

1. Technical Field

Exemplary embodiments of the present invention relate to a thin-film transistor (TFT) array substrate, a display apparatus including the same, and a method of manufacturing the TFT array substrate.

2. Discussion of Related Art

A display apparatus, such as an organic light-emitting display apparatus, a liquid crystal display apparatus, or the like, may include a thin-film transistor (TFT), a capacitor, and a plurality of wirings.

A substrate used to manufacture a display apparatus may include minute patterns for TFTs, capacitors, wirings, and the like, and the display apparatus operates by a complex connection between the TFTs, capacitors, wirings, and the like.

Recently, according to an increase in the demand for a compact and high-resolution display, a more efficient space layout and connection structure is needed between TFTs, capacitors, and wirings included in a display apparatus.

SUMMARY

At least one embodiment of the present invention includes a thin-film transistor (TFT) array substrate having an efficient space layout and connection structure, a display apparatus including the same, and a method of manufacturing the TFT array substrate.

According to an exemplary embodiment of the present invention, a thin-film transistor (TFT) array substrate includes: a TFT including ant active layer, a gate electrode, a source electrode, and a drain electrode; a first conductive layer formed in the same layer as any one selected from the active layer, the gate electrode, the source electrode, and the drain electrode; a second conductive layer disposed in a different layer from the first conductive layer; a node contact hole including a first contact hole part which exposes the first conductive layer, a second contact hole part which exposes the second conductive layer, and a connection part which connects the first contact hole part and the second contact hole part and has a width that is smaller than a width of the first contact hole part and a width of the second contact hole part; and a connection node formed in the node contact hole to electrically connect the first conductive layer and the second conductive layer.

A length of the connection part in a direction extending from the first contact hole part to the second contact hole part may be 1.5 μm or less.

The TFT array substrate may further include a first insulating layer disposed between the first conductive layer and the second conductive layer, wherein the first conductive layer and the second conductive layer are separated from each other by the first insulating layer.

The TFT array substrate may further include a second insulating layer disposed on the second conductive layer, wherein a partial region of the second insulating layer is disposed between the first contact hole part and the second contact hole part.

The connection part which connects the first contact hole part and the second contact hole part may be disposed on the second insulating layer disposed between the first contact hole part and the second contact hole part.

The TFT may include: a first TFT including a first active layer, a first gate electrode, a first source electrode, and a first drain electrode; and a second TFT including a second active layer, a second gate electrode, a second source electrode, and a second drain electrode, and the first gate electrode and the second gate electrode may be disposed in different layers from each other.

The TFT array substrate may further include a capacitor including a lower electrode disposed in the same layer as the second gate electrode and an upper electrode disposed in the same layer as the first gate electrode, wherein the first conductive layer is disposed in the same layer as the first active layer and the second active layer, and the second conductive layer is disposed in the same layer as the lower electrode or the upper electrode of the capacitor.

According to an exemplary embodiment of the present invention, a method of manufacturing a thin-film transistor (TFT) array substrate includes: forming a first conductive layer in the same layer as any one selected from an active layer, a gate electrode, a source electrode, and a drain electrode included in a TFT; forming a second conductive layer in a different layer from the first conductive layer; forming a node contact hole including a first contact hole part which exposes the first conductive layer, a second contact hole part which exposes the second conductive layer, and a connection part which connects the first contact hole part and the second contact hole part and has a width that is smaller than a width of the first contact hole part and a width of the second contact hole part; and forming a connection node in the node contact hole to electrically connect the first conductive layer and the second conductive layer.

The forming of the node contact hole may include forming the node contact hole by applying light to a mask including a first opening and a second opening respectively corresponding to the first contact hole part and the second contact hole part.

A spacing distance between the first opening and the second opening included in the mask may be 1.5 μm or less.

The method may further include: forming a first insulating layer after forming the first conductive layer; and forming a second insulating layer after forming the second conductive layer.

The forming of the node contact hole may include: forming the first contact hole part which exposes the first conductive layer by etching the first insulating layer and the second insulating layer; forming the second contact hole part which exposes the second conductive layer by etching the second insulating layer; and forming the connection part by etching a portion of the second insulating layer which is disposed between the first contact hole part and the second contact hole part.

According to an exemplary embodiment of the present invention, a display apparatus includes: a plurality of pixels, each pixel including a pixel circuit, which includes at least one thin-film transistor (TFT) and at least one capacitor and is connected to a plurality of wirings, and a display device connected to the pixel circuit; a first conductive layer which is located in the pixel and is formed in the same layer as any one selected from an active layer, a gate electrode, a source electrode, and a drain electrode included in the TFT; a second conductive layer disposed in a different layer from the first conductive layer; a node contact hole including a first contact hole part which exposes the first conductive layer, a second contact hole part which exposes the second conductive layer, and a connection part which connects the first contact hole part and the second contact hole part and having a width that is smaller than a width of the first contact hole part and a width of the second contact hole part; and a connection node formed in the node contact hole to electrically connect the first conductive layer and the second conductive layer.

A length of the connection part in a direction extending from the first contact hole part to the second contact hole part may be 1.5 µm or less.

The display apparatus may further include a first insulating layer disposed between the first conductive layer and the second conductive layer, wherein the first conductive layer and the second conductive layer are separated from each other by the first insulating layer.

The display apparatus may further include a second insulating layer disposed on the second conductive layer, wherein a partial region of the second insulating layer is disposed between the first contact hole part and the second contact hole part.

The connection part which connects the first contact hole part and the second contact hole part may be disposed on the second insulating layer disposed between the first contact hole part and the second contact hole part.

The TFT may include: a first TFT including a first active layer, a first gate electrode, a first source electrode, and a first drain electrode; and a second TFT including a second active layer, a second gate electrode, a second source electrode, and a second drain electrode, and the first gate electrode and the second gate electrode may be disposed in different layers from each other.

The display apparatus may further include a capacitor including a lower electrode disposed in the same layer as the second gate electrode and an upper electrode disposed in the same layer as the first gate electrode, wherein the first conductive layer is disposed in the same layer as the first active layer and the second active layer, and the second conductive layer is disposed in the same layer as the lower electrode or the upper electrode of the capacitor.

The display device may be an organic light-emitting device (OLED) including a first electrode, a second electrode, and an organic emission layer disposed between the first electrode and the second electrode.

According to an exemplary embodiment of the present invention, a thin-film transistor (TFT) array substrate includes: a first TFT including a first active layer, a first gate electrode, a first source electrode, and a first drain electrode; a first conductive layer disposed in a same layer as one of the first active layer, the first gate electrode, the first source electrode, and first the drain electrode; a second conductive layer disposed in a different layer from the first conductive layer; a first insulating layer including first and second insulating parts spaced apart from one another and disposed on the first conductive layer; a second insulating layer including third, fourth, and fifth insulating parts spaced apart from one another, the third insulating part disposed on the first insulating part, and the fourth and fifth insulating parts disposed on the second insulating part and the second conductive layer; and a connection node to electrically connect the first conductive layer and the second conductive layer.

The connection node may be located in a dumbbell shaped hole.

In an exemplary embodiment, the connection node is located in a hole having first, second, and third sections and the second section is located between the first and third sections and has a width smaller than the first and third sections.

In an exemplary embodiment, the fourth insulating part is located between the third and fifth insulating parts and the connection node surrounds the fourth insulating part.

The first and second conductive layers may overlap one another, or a width of the fourth insulating part may be configured to prevent the overlap.

BRIEF DESCRIPTION OF THE DRAWINGS

Embodiments of the invention will become apparent and more readily appreciated from the following description of the embodiments, taken in conjunction with the accompanying drawings in which.

DETAILED DESCRIPTION

Reference will now be made in detail to exemplary embodiments of the invention, which are illustrated in the accompanying drawings, wherein like reference numerals refer to like elements throughout. However, embodiments of the invention may have different forms and should not be construed as being limited to the descriptions set forth herein.

As used herein, the singular forms "a," "an" and "the" are intended to include the plural forms as well, unless the context clearly indicates otherwise. Sizes of elements in the drawings may be exaggerated for convenience of explanation. In other words, since sizes and thicknesses of components in the drawings are arbitrarily illustrated for convenience of explanation, the following embodiments are not limited thereto.

Although an active matrix (AM)-type organic light-emitting display apparatus of a six-TR and one-Cap structure in which one pixel includes six TFTs and one capacitor is shown in the accompanying drawings, embodiments of the present invention are not limited thereto. Thus, a display apparatus may be formed to have a structure in which one pixel includes a plurality of TFTs less than or greater than six TFTs and more than one capacitor or to have various structures such that a separate wiring is further formed or an existing wiring is omitted. Herein, the pixel indicates a minimum unit for displaying an image, and a display apparatus displays an image through a plurality of pixels.

Figure 1:
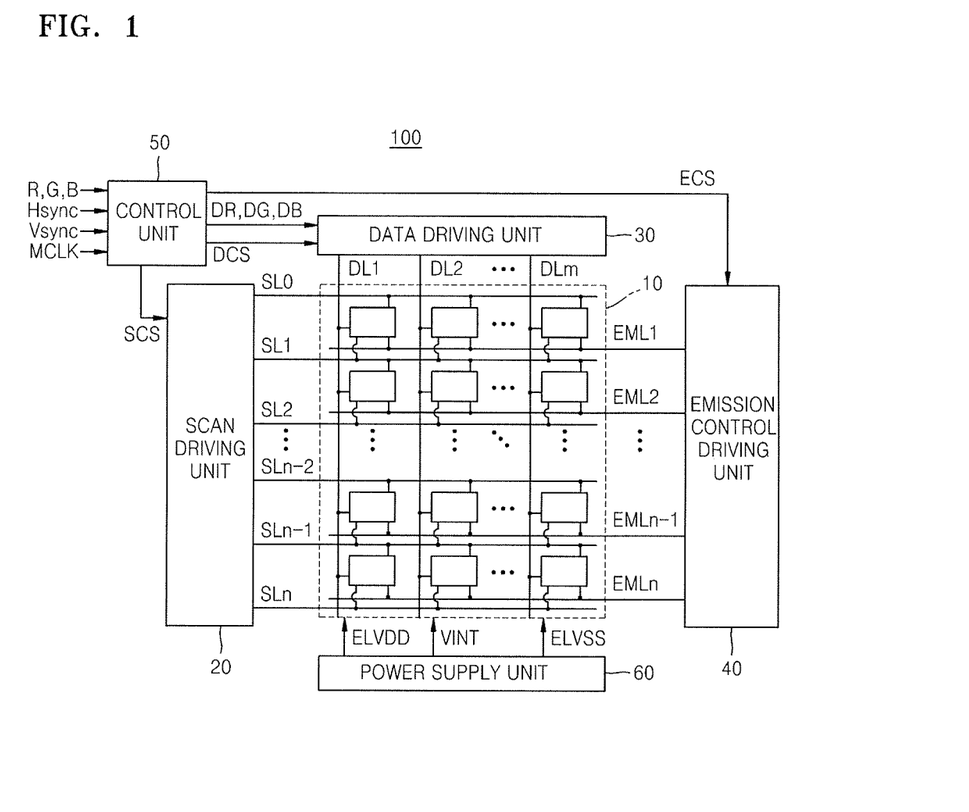
FIG. 1 is a block diagram of a display apparatus according to an exemplary embodiment of the present invention.
Figure 2:
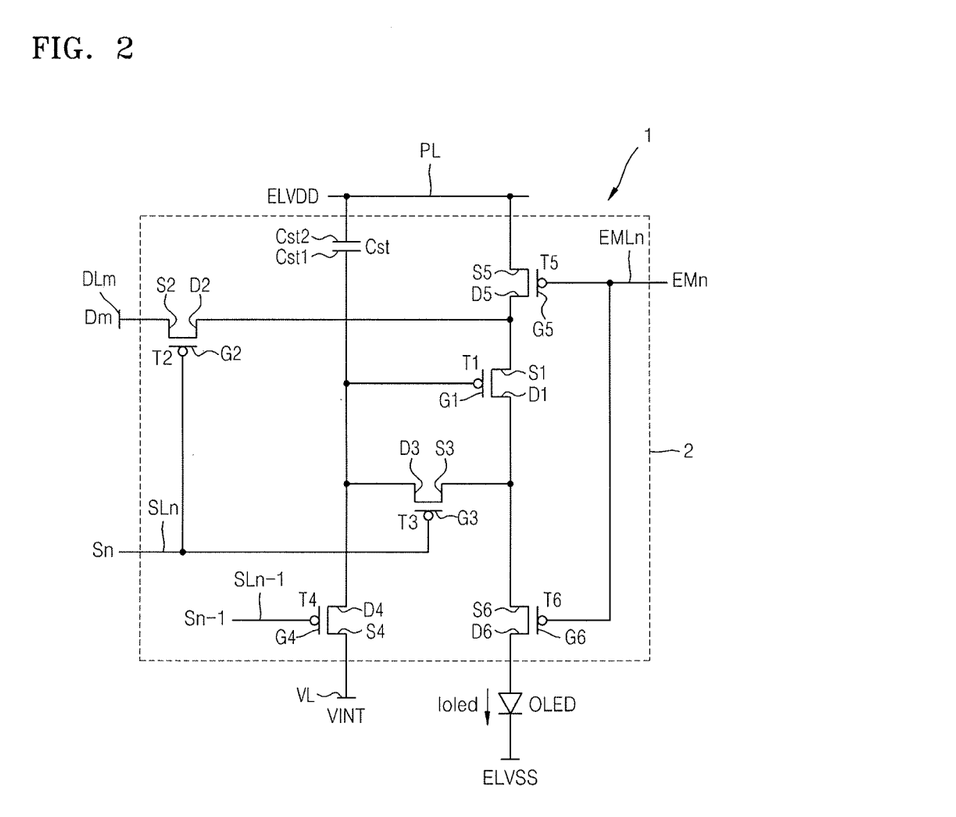
FIG. 2 is an equivalent circuit diagram of one pixel in the display apparatus according to an exemplary embodiment of the present invention.

FIG. 1 is a block diagram of a display apparatus 100 according to an exemplary embodiment of the present invention, and FIG. 2 is an equivalent circuit diagram of one pixel 1 in the display apparatus 100 according to an exemplary embodiment of the present invention.

The display apparatus 100 includes a display unit 10 including a plurality of pixels, a scan driving unit 20, a data driving unit 30, an emission control driving unit 40, a control unit 50, and a power supply unit 60 which supplies external power to the display apparatus 100.

The display unit 10 includes the plurality of pixels that are located at crossings of a plurality of scan lines SL0 to SLn, a plurality of data lines DL1 to DLm, and a plurality of emission control lines EML1 to EMLn and are approximately arranged in a matrix form. The plurality of pixels receives external voltages, such as a first power source voltage ELVDD, a second power source voltage ELVSS, an initialization voltage VINT, and the like, from the power supply unit 60. The first power source voltage ELVDD may be a predetermined high-level voltage, and the second power source voltage ELVSS may be lower than the first power source voltage ELVDD or may be a ground voltage.

Each pixel is connected to two of the plurality of scan lines SL0 to SLn connected to the display unit 10. In FIG. 1, each pixel is connected to a scan line corresponding to a corresponding pixel line and a scan line corresponding to a previous pixel line but is not necessarily limited thereto.

Each pixel is connected to one of the plurality of data lines DL1 to DLm connected to the display unit 10 and one of the plurality of emission control lines EML1 to EMLn connected to the display unit 10.

The scan driving unit 20 generates two corresponding scan signals and transmits the two corresponding scan signals to each pixel through the plurality of scan lines SL0 to SLn. That is, the scan driving unit 20 transmits a first scan signal Sn through a scan line corresponding to a pixel line to which each pixel belongs and transmits a second scan signal Sn−1 through a scan line corresponding to a previous pixel line of the corresponding pixel line. For example, the scan driving unit 20 transmits the first scan signal Sn to a pixel, which is disposed on an nth pixel line and an mth column line, through a first scan line SLn and transmits the second scan signal Sn−1 to the pixel through a second scan line SLn−1.

The data driving unit 30 transmits a plurality of data signals D1 to Dm to the plurality of pixels through the plurality of data lines DL1 to DLm.

The emission control driving unit 40 generates a plurality of emission control signals EM1 to EMn and transmits the plurality of emission control signals EM1 to EMn to the plurality of pixels through the plurality of emission control lines EML1 to EMLn.

The control unit 50 converts a plurality of image signals R, G, and B transmitted from the outside into a plurality of image data signals DR, DG, and DB and transmits the plurality of image data signals DR, DG, and DB to the data driving unit 30. In addition, the control unit 50 receives a vertical synchronization signal Vsync, a horizontal synchronization signal Hsync, and a clock signal MCLK, generates control signals for controlling the scan driving unit 20, the data driving unit 30, and the emission control driving unit 40, and transmits the control signals to the scan driving unit 20, the data driving unit 30, and the emission control driving unit 40. That is, the control unit 50 generates a scan driving control signal SCS for controlling the scan driving unit 20, a data driving control signal DCS for controlling the data driving unit 30, and an emission driving control signal ECS for controlling the emission control driving unit 40 and transmits the scan driving control signal SCS to the scan driving unit 20, the data driving control signal DCS to the data driving unit 30, and the emission driving control signal ECS to the emission control driving unit 40.

Each of the plurality of pixels emits light of a predetermined brightness by a driving current supplied to an organic light-emitting device (OLED) in response to the plurality of data signals D1 to Dm transmitted through the plurality of data lines DL1 to DLm.

The pixel 1 shown in FIG. 2 is one of the plurality of pixels belonging to the nth pixel line and is connected to the nth scan line SLn corresponding to the nth pixel line and the (n−1)th scan line SLn−1 corresponding to an (n−1)th pixel line that is a previous pixel line of the nth pixel line.

The pixel 1 of the display apparatus according to an embodiment of the present invention includes a pixel circuit 2 including a plurality of thin film transistors (TFTs) T1 to T6 and a storage capacitor Cst. In addition, the pixel 1 includes an OLED that emits light by receiving a driving voltage through the pixel circuit 2.

The plurality of TFTs T1 to T6 include a driving TFT T1, a switching TFT T2, a compensation TFT T3, an initialization TFT T4, an operation control TFT T5, and an emission control TFT T6.

The pixel 1 includes the first scan line SLn for delivering the first scan signal Sn to the switching TFT T2 and the compensation TFT T3, the second scan line SLn−1 for delivering the second scan signal Sn−1 that is a previous scan signal to the initialization TFT T4, an emission control line EMLn for delivering an emission control signal EMn to the operation control TFT T5 and the emission control TFT T6, a data line DLm that crosses the first scan line SLn and delivers a data signal Dm, a driving voltage line PL that delivers the first power source voltage ELVDD, and an initialization voltage line VL that delivers the initialization voltage VINT for initializing the driving TFT T1. The driving voltage line PL may be formed in parallel or substantially in parallel with the data line DLm.

A gate electrode G1 of the driving TFT T1 is connected to a lower electrode Cst1 of the storage capacitor Cst. A source electrode S1 of the driving TFT T1 is connected to the driving voltage line PL via the operation control TFT T5. A drain electrode D1 of the driving TFT T1 is electrically coupled to an anode electrode of the OLED via the emission control TFT T6. The driving TFT T1 supplies the driving current Ioled to the OLED in response to the data signal Dm received according to a switching operation of the switching TFT T2.

A gate electrode G2 of the switching TFT T2 is connected to the first scan line SLn. A source electrode S2 of the switching TFT T2 is connected to the data line DLm. A drain electrode D2 of the switching TFT T2 is connected to the source electrode S1 of the driving TFT T1 and is connected to the driving voltage line PL via the operation control TFT T5. The switching TFT T2 is turned on according to the first scan signal Sn received through the first scan line SLn and performs a switching operation for delivering the data signal Dm received through the data line DLm to the source electrode S1 of the driving TFT T1.

A gate electrode G3 of the compensation TFT T3 is connected to the first scan line SLn. A source electrode S3 of the compensation TFT T3 is connected to the drain electrode D1 of the driving TFT T1 and is connected to the anode electrode of the OLED via the emission control TFT T6. A drain electrode D3 of the compensation TFT T3 is connected to the lower electrode Cst1 of the storage capacitor Cst, a drain electrode D4 of the initialization TFT T4, and the gate electrode G1 of the driving TFT T1. The compensation TFT T3 is turned on according to the first scan signal Sn received through the first scan line SLn and connects the gate electrode G1 and the drain electrode D1 of the driving TFT T1 to each other, thereby causing the driving TFT T1 to be in a diode connection state.

A gate electrode G4 of the initialization TFT T4 is connected to the second scan line SLn−1. A source electrode S4 of the initialization TFT T4 is connected to the initialization voltage line VL. The drain electrode D4 of the initialization TFT T4 is connected to the lower electrode Cst1 of the storage capacitor Cst, the drain electrode D3 of the compensation TFT T3, and the gate electrode G1 of the driving TFT T1. The initialization TFT T4 is turned on according to the second scan signal Sn−1 received through the second scan line SLn−1 and delivers the initialization voltage VINT to the gate electrode G1 of the driving TFT T1 to thereby perform an initialization operation for initializing a voltage of the gate electrode G1 of the driving TFT T1.

A gate electrode G5 of the operation control TFT T5 is connected to the emission control line EMLn. A source electrode S5 of the operation control TFT T5 is connected to the driving voltage line PL. A drain electrode D5 of the operation control TFT T5 is connected to the source electrode S1 of the driving TFT T1 and the drain electrode D2 of the switching TFT T2.

A gate electrode G6 of the emission control TFT T6 is connected to the emission control line EMLn. A source electrode S6 of the emission control TFT T6 is connected to the drain electrode D1 of the driving TFT T1 and the source electrode S3 of the compensation TFT T3. A drain electrode D6 of the emission control TFT T6 is electrically coupled to the anode electrode of the OLED. The operation control TFT T5 and the emission control TFT T6 are simultaneously turned on according to the emission control signal EMn received through the emission control line EMLn and deliver the first power source voltage ELVDD to the OLED, thereby causing the driving current Ioled to flow through the OLED.

An upper electrode Cst2 of the storage capacitor Cst is connected to the driving voltage line PL. The lower electrode Cst1 of the storage capacitor Cst is connected to the gate electrode G1 of the driving TFT T1, the drain electrode D3 of the compensation TFT T3, and the drain electrode D4 of the initialization TFT T4.

A cathode electrode of the OLED is connected to the second power source voltage ELVSS. The OLED displays an image by receiving the driving current Ioled from the driving TFT T1 and emitting light.

Figure 3:
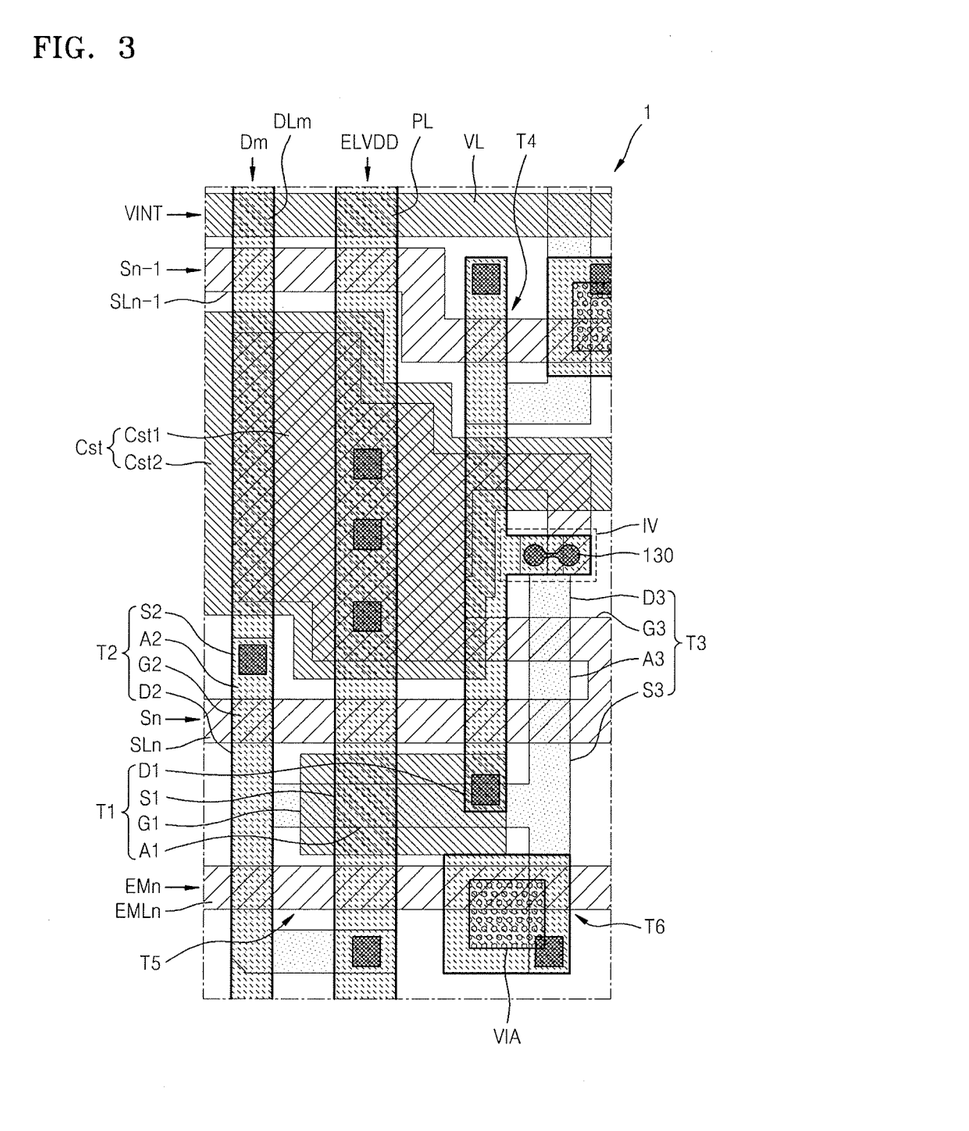
FIG. 3 is a top view of the pixel of FIG. 2, according to an exemplary embodiment of the present invention.
Figure 4:
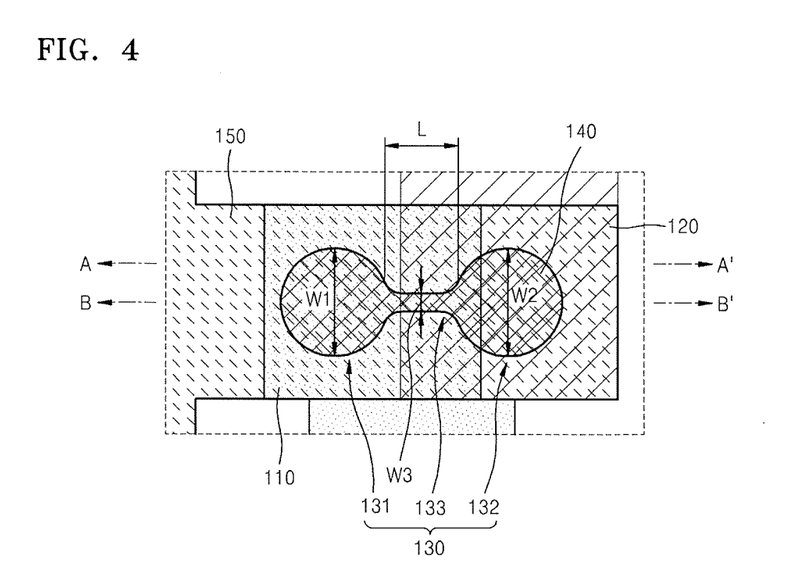
FIG. 4 is a magnified top view of a region IV of FIG. 3.
Figure 5:
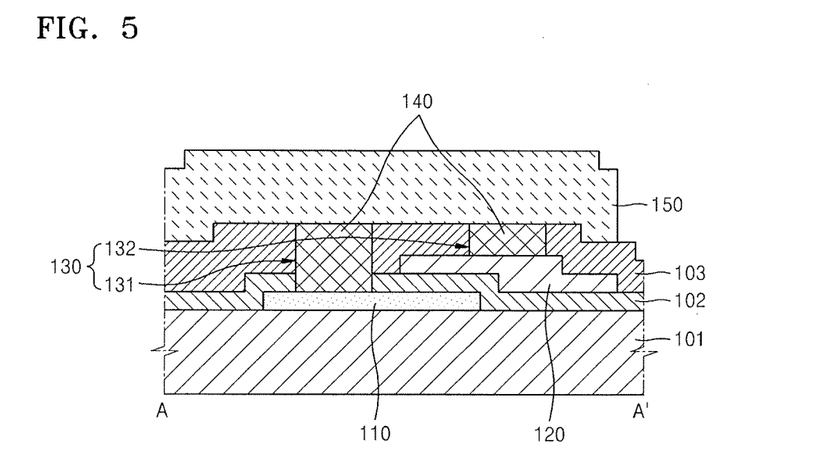
FIG. 5 is a cross-sectional view along A-A' of FIG. 4.
Figure 6:
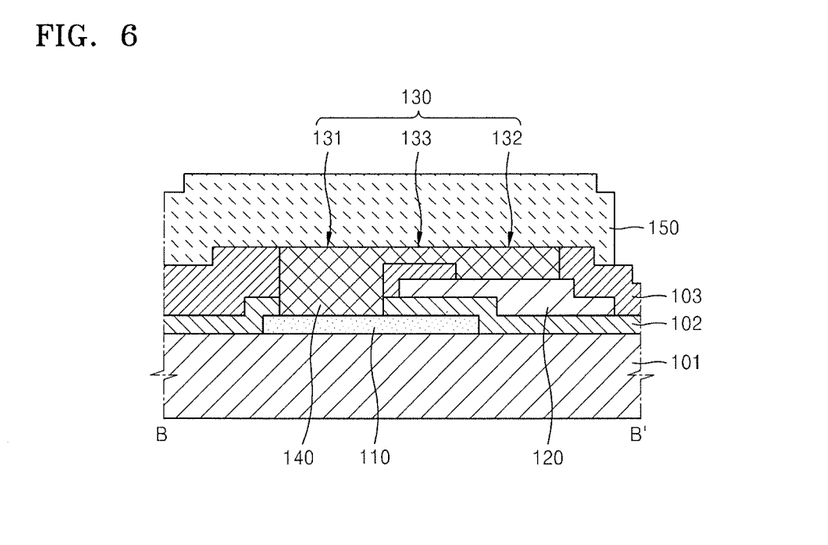
FIG. 6 is a cross-sectional view along B-B' of FIG. 4.

FIG. 3 is a top view of the pixel 1 of FIG. 2, according to an exemplary embodiment of the present invention, FIG. 4 is a magnified top view of a region IV of FIG. 3, FIG. 5 is a cross-sectional view along A-A' of FIG. 4, and FIG. 6 is a cross-sectional view along B-B' of FIG. 4.

Referring to FIG. 3, the pixel 1 includes the first scan line SLn, the second scan line SLn−1, the emission control line EMLn, and the initialization voltage line VL which respectively apply the first scan signal Sn, the second scan signal Sn−1, and the emission control signal EMn, and the initialization voltage VINT and are formed along a row direction and includes the data line DLm and the driving voltage line PL which cross the first scan line SLn, the second scan line SLn−1, the emission control line EMLn, and the initialization voltage line VL and respectively apply the data signal Dm and the first power source voltage ELVDD.

The first scan line SLn, the second scan line SLn−1, and the emission control line EMLn may belong to a first gate wiring, and the initialization voltage line VL may belong to a second gate wiring.

Since the first gate wiring and the second gate wiring are located in different layers from each other to thereby make narrow a distance between neighboring gate wirings located in different layers from each other, relatively many pixels may be formed in a same area. That is, a display apparatus of a high resolution may be formed.

The data line DLm and the driving voltage line PL are second signal wirings located on the second gate wiring. The second signal wirings cross first signal wirings including the first gate wiring and the second gate wiring. The second signal wirings are formed as low-resistance wirings.

In addition, the pixel 1 includes the driving TFT T1, the switching TFT T2, the compensation TFT T3, the initialization TFT T4, the operation control TFT T5, the emission control TFT T6, and the storage capacitor Cst. Although not shown, an OLED including a first electrode (anode electrode), an organic emission layer, and a second electrode (cathode electrode) may be formed in a region corresponding to a via hole VIA.

When the OLED is a full-color OLED, the organic emission layer may be patterned as a red emission layer, a green emission layer, and a blue emission layer according to a red sub-pixel, a green sub-pixel, and a blue sub-pixel, respectively.

The organic emission layer may have a multi-layer structure in which a red emission layer, a green emission layer, and a blue emission layer are stacked to emit light of a white color or have a single-layer structure including a red emission material, a green emission material, and a blue emission material. The OLED including the organic emission layer may emit a full color by additionally including a red color filter, a green color filter, and a blue color filter.

The driving TFT T1 includes an active layer A1, the gate electrode G1, the source electrode S1, and the drain electrode D1. In an exemplary embodiment, the gate electrode G1 belongs to the second gate wiring.

The switching TFT T2 includes an active layer A2, the gate electrode G2, the source electrode S2, and the drain electrode D2. In an exemplary embodiment, the gate electrode G2 belongs to the first gate wiring.

That is, in an exemplary embodiment, the gate electrode G1 and the gate electrode G2 are disposed in different layers from each other.

The compensation TFT T3 includes an active layer A3, the gate electrode G3, the source electrode S3, and the drain electrode D3. In an exemplary embodiment, the gate electrode G3 belongs to the first gate wiring, the source electrode S3 corresponds to a compensation source region doped with impurities in the active layer A3, and the drain electrode D3 corresponds to a compensation drain region doped with impurities in the active layer A3. The compensation TFT T3 forms a dual-gate electrode to prevent a leakage current.

The gate electrodes G4 to G6 of the other TFTs T4 to T6 may belong to the first gate wiring or the second gate wiring. In addition, in an exemplary embodiment, the lower electrode Cst1 of the storage capacitor Cst belongs to the first gate wiring, and the upper electrode Cst2 of the storage capacitor Cst belongs to the second gate wiring.

Referring to FIG. 4, in an exemplary embodiment, a first conductive layer 110 extending from the active layer A3 and a second conductive layer 120 extending from the lower electrode Cst1 of the storage capacitor Cst is electrically connected to each other using a node contact hole 130 and a connection node 140.

The first conductive layer 110 and the second conductive layer 120 are separated by a first insulating layer 102 shown in FIG. 5 and disposed in different layers from each other, and the node contact hole 130 includes a first contact hole part 131 which exposes the first conductive layer 110, a second contact hole part 132 which exposes the second conductive layer 120, and a connection part 133 which connects the first contact hole part 131 and the second contact hole part 132.

A width W3 of the connection part 133 is smaller than a width W1 of the first contact hole part 131 and a width W2 of the second contact hole part 132. As a result, the node contact hole 130 may have a shape of a dumbbell (e.g., a shape of a peanut) at a top view.

However, the shape of the node contact hole 130 is not limited thereto. For example, the widths W1-W3 may be varied to form the node contact hole 130 into various shapes. That is, a top view shape of the node contact hole 130 may be various, such as a shape of the capital letter I, a ribbon shape, and the like.

In an exemplary embodiment, a length L of the connection part 133 in a direction extending from the first contact hole part 131 to the second contact hole part 132 is 1.5 μm or less.

The shape of the node contact hole 130 and the length L of the connection part 133 will be described in detail with respect to FIGS. 9 and 10 in which a manufacturing method is described.

Referring to FIG. 5 showing a cross-sectional view along A-A' in FIG. 4 and FIG. 6 showing a cross-sectional view along B-B' in FIG. 4, the first conductive layer 110 is disposed on a substrate 101, and the first insulating layer 102 is disposed on the first conductive layer 110. In an exemplary embodiment, the first conductive layer 110 is formed in the same layer as an active layer of a TFT, and specifically, formed of the same material as a source region and a drain region which are conductive by doping impurities into a semiconductor material forming the active layer. The semiconductor material may be poly silicon but is not limited thereto. For example, the semiconductor material may be an oxide semiconductor.

In the current embodiment, the first conductive layer 110 corresponds to a drain region of the compensation TFT T3 but is not limited thereto.

The second conductive layer 120 is disposed on the first insulating layer 102. That is, the first conductive layer 110 and the second conductive layer 120 are insulated from one another by the first insulating layer 102. In this case, the second conductive layer 120 may correspond to a region in which the lower electrode Cst1 of the storage capacitor Cst extends.

In the current embodiment, the lower electrode Cst1 of the storage capacitor Cst belongs to the first gate wiring and may be formed in the same layer and of the same material as the gate electrode G2 of the switching TFT T2. However, embodiments of the present invention are not limited thereto, and the second conductive layer 120 may be disposed in any conductive layer which is different from the layer in which the first conductive layer is disposed, and the lower electrode Cst1 of the storage capacitor Cst may not necessarily belong to the first gate wiring.

In addition, in the current embodiment, the first conductive layer 110 and the second conductive layer 120 may be disposed to overlap each other when viewed from the top.

In this case, since the use of a space is maximized by reducing a design margin of a display apparatus, the current embodiment is suitable for a high-resolution pixel design.

A second insulating layer 103 is disposed on the second conductive layer 120.

That is, the first insulating layer 102 and the second insulating layer 103 are disposed on the first conductive layer 110, and the first contact hole part 131 which exposes the first conductive layer 110 by penetrating the first insulating layer 102 and the second insulating layer 103 is disposed on the first conductive layer 110. In addition, the second contact hole part 132 which exposes the second conductive layer 120 by penetrating the second insulating layer 103 is disposed in a region of the second insulating layer 103 corresponding to the second conductive layer 120.

Thus, a partial region of the second insulating layer 103 is disposed between the first contact hole part 131 and the second contact hole part 132.

Referring to FIG. 6, the connection part 133 which connects the first contact hole part 131 and second contact hole part 132 is disposed on the second insulating layer 103 disposed between the first contact hole part 131 and the second contact hole part 132. Since the width W3 of the connection part 133 is smaller than the width W1 of the first contact hole part 131 and the width W2 of the second contact hole part 132, the connection part 133 is not shown in the cross-section view along A-A'.

That is, the second insulating layer 103 which is disposed between the first contact hole part 131 and the second contact hole part 132 and corresponds to a region connecting the center of the first contact hole part 131 and the center of the second contact hole part 132 is formed to have a lower height, i.e., a thinner width, than the second insulating layer 103 in the other regions, and the connection part 133 is disposed in a region corresponding to the second insulating layer 103 which corresponds to the region connecting the center of the first contact hole part 131 and the center of the second contact hole part 132.

The connection node 140 which electrically connects the first conductive layer 110 and the second conductive layer 120 is disposed in the node contact hole 130.

The connection node 140 may be formed of any material having conductivity, and a top view shape of the connection node 140 may also be a dumbbell shape (e.g., peanut shape) or the like.

A third conductive layer 150 formed in the same layer and of the same material as source and drain electrodes of a TFT may be disposed on the connection node 140.

Figure 7:
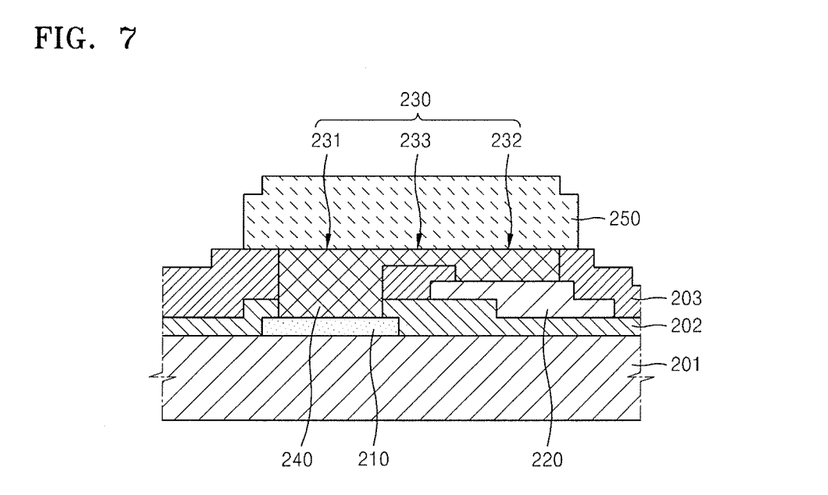
FIG. 7 is a cross-sectional view of a node contact hole included in a display apparatus according to an exemplary embodiment of the present invention.

FIG. 7 is a cross-sectional view of a node contact hole 230 included in a display apparatus according to an exemplary embodiment of the present invention.

Referring to FIG. 7, the display apparatus may include a first conductive layer 210 disposed in the same layer as an active layer of a TFT on a substrate 201, a first insulating layer 202 disposed on the first conductive layer 210, a second conductive layer 220 disposed on the first insulating layer 202, a second insulating layer 203 disposed on the second conductive layer 220, the node contact hole 230 and a connection node 240 which electrically connects the first conductive layer 210 and the second conductive layer 220.

A third conductive layer 250 is disposed on the second insulating layer 203 and the connection node 240.

In this case, the first conductive layer 210 and the second conductive layer 220 are separated by the first insulating layer 202 and do not overlap each other when viewed from the top. That is, the node contact hole 230 may be applied not only to a case where two conductive layers overlap each other in a top view but also to a case where two conductive layers do not overlap each other in a top view.

An embodiment of the invention can be described in terms of the placement of parts of the insulating layers (e.g., 102/202, 103/203) that enable the node contact hole (e.g., 230/330) to have its shape. The first insulating layer (e.g., 102/202) can be described as having first and second insulating parts that are spaced apart from one another and disposed on the first conductive layer (e.g., 110/210). As shown in FIG. 6, a first part of the first insulating layer 102 is disposed on a left side of the first conductive layer 110, and a second part of the first insulating layer 102 is disposed on right side of the first conductive layer 110. The second insulating layer (e.g., 103/203) can be described as having first, second, and third insulating parts (e.g., third-fifth insulating parts relative to the first and second insulating parts) that are spaced apart from one another. As shown in FIG. 6, a first part of the second insulating layer 103 is disposed on the first part of the first insulating layer 102, a second part of the second insulating layer 103 is disposed on the left side of the second part of the first insulating layer 102, and a third part of the second insulating layer 103 is disposed on the right side of the second part of the first insulating 102. The connection node (e.g., 140/240) is located in a hole formed by the spaces between the insulating parts, which can described as having a dumbbell shape or having first-third sections, where the middle second section has a width less than the other sections. As shown in FIG. 6 and FIG. 7, the first conductive layer (e.g., 110/210) and second conductive layer (e.g., 120/220) may or may not overlap one another. For example, as shown in FIG. 6, a width of a portion of the middle part of the second insulating layer 203 can be configured to be narrow enough to allow the two conductive layers 210 and 220 to overlap one another, or as shown in FIG. 7, wide enough to prevent such an overlap.

Figure 8:
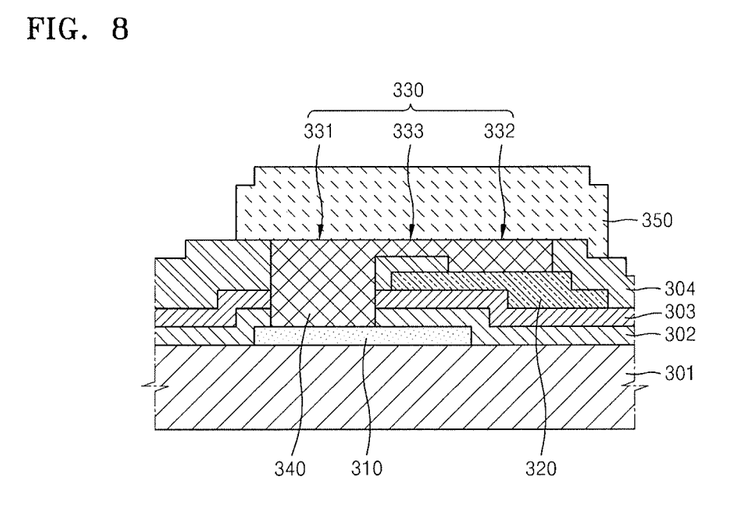
FIG. 8 is a cross-sectional view of a node contact hole included in a display apparatus according to an exemplary embodiment of the present invention.

FIG. 8 is a cross-sectional view of a node contact hole 330 included in a display apparatus according to an exemplary embodiment of the present invention.

Referring to FIG. 8, the display apparatus may include a first conductive layer 310 disposed in the same layer as an active layer of a TFT on a substrate 301, first and second insulating layers 302 and 303 disposed on the first conductive layer 310, a second conductive layer 320 disposed on the second insulating layer 303, and a third insulating layer 304 disposed on the second conductive layer 320.

That is, the second conductive layer 320 may be disposed in a different layer from a layer in which the second conductive layer 120 of FIG. 6 is disposed and may belong to the second gate wiring. In this embodiment, the second conductive layer 320 may be formed in the same layer as the upper electrode Cst2 of the storage capacitor Cst included in the display apparatus.

The first conductive layer 310 and the second conductive layer 320 are electrically connected to each other by the node contact hole 330 and a connection node 340, and a third conductive layer 350 may be disposed on the third insulating layer 304 and the connection node 340.

In addition, an additional conductive layer belonging to the first gate wiring may be disposed between the first and second insulating layers 302 and 303.

In the embodiments described above, the node contact hole 130, 230, or 330 which electrically connects the first conductive layer 110, 210, or 310 formed on the same layer as an active layer and the second conductive layer 120, 220, or 320 formed in the same layer as the lower electrode Cst1 or the upper electrode Cst2 of the storage capacitor Cst has been described, but embodiments of the present invention are not limited thereto.

Thus, the present disclosure may be applied to an embodiment where a node contact hole is formed to connect conductive layers formed in different layers and between adjacent devices or wirings as described in the embodiments.

Figure 9:
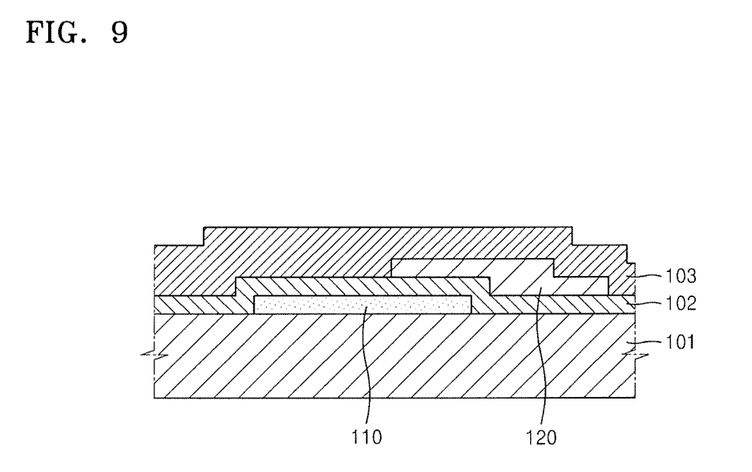
FIGS. 9 and 10 are cross-sectional views illustrating a method of manufacturing a display apparatus, according to an exemplary embodiment of the present invention.
Figure 10:
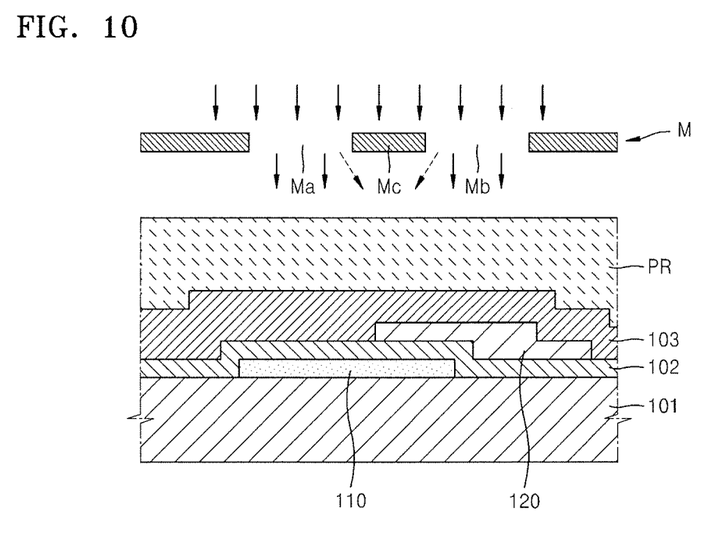
Figure 11:
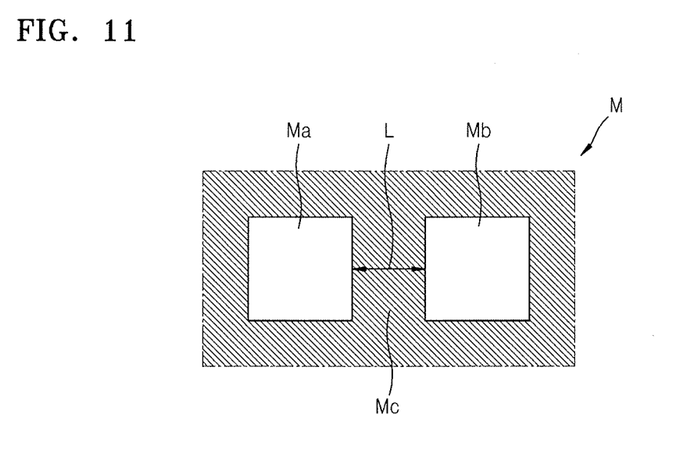
FIG. 11 is a top view of a mask of FIG. 10.

FIGS. 9 and 10 are cross-sectional views illustrating a method of manufacturing a display apparatus, according to an exemplary embodiment of the present invention, and FIG. 11 is a top view of a mask M of FIG. 10.

Referring to FIG. 9, the first conductive layer 110, the first insulating layer 102, the second conductive layer 120, and the second insulating layer 103 are sequentially formed on the substrate 101.

Referring to FIGS. 10 and 11, a photoresist PR is coated on the second insulating layer 103, and thereafter, the mask M is irradiated (e.g., treated with light) by using a light-exposure device.

The mask M includes a first opening Ma and a second opening Mb respectively corresponding to the first contact hole part 131 and the second contact hole part 132. In an exemplary embodiment, a spacing distance L between the first opening Ma and the second opening Mb is 1.5 µm or less.

When the spacing distance L between the first opening Ma and the second opening Mb is 1.5 µm or less, a diffraction phenomenon may occur when the mask M is irradiated (e.g., treated with light). That is, a region Mc which corresponds to the connection part 133 and is not open is disposed between the first opening Ma and the second opening Mb, and a portion of the light is also applied to a region corresponding to the connection part 133 between the first contact hole part 131 and the second contact hole part 132 due to the diffraction phenomenon.

The intensity of light applied to the second insulating layer 103 due to the diffraction phenomenon varies according to a location. The intensity of light applied to a region corresponding to a line (or a region) connecting the center of the first contact hole part 131 and the center of the second contact hole part 132 may be greater than the intensity of light applied to a surrounding region.

In an exemplary embodiment, the spacing distance L between the first opening Ma and the second opening Mb is 0.5 µm or less to be suitable for a high-resolution pixel design.

Figure 12:
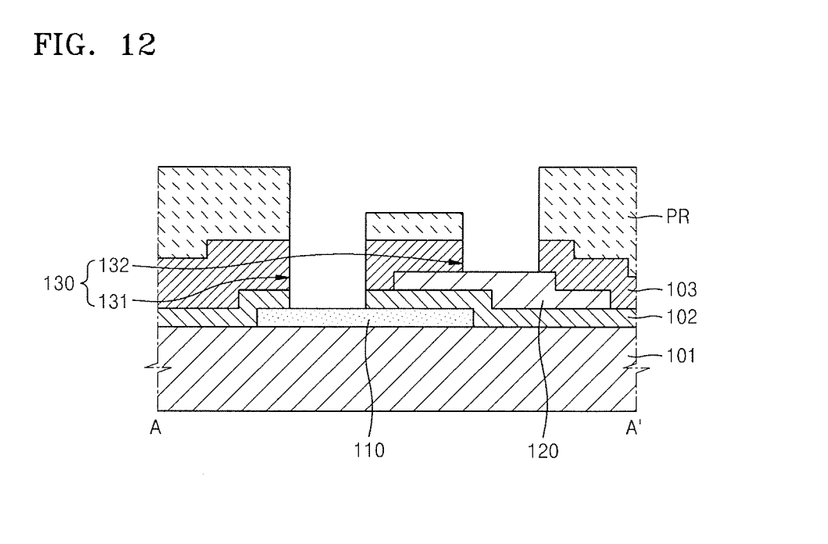
FIGS. 12 to 14 are cross-sectional views of a region corresponding to A-A' of FIG. 4 in a method of manufacturing a display apparatus, according to an exemplary embodiment of the present invention.
Figure 13:
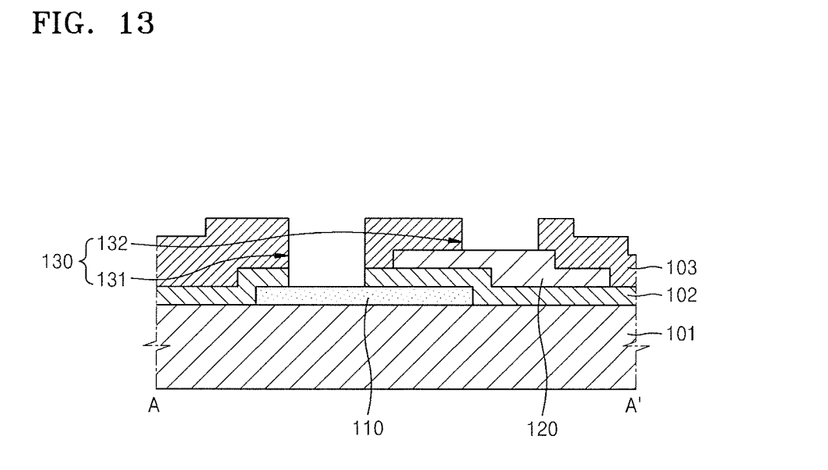
Figure 14:
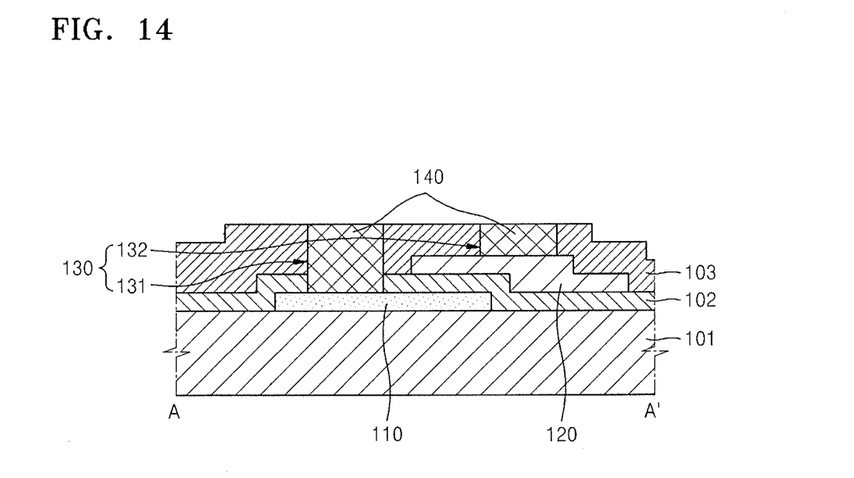

FIGS. 12 to 14 are cross-sectional views of a region corresponding to A-A' of FIG. 4 in the method of manufacturing a display apparatus, according to an exemplary embodiment of the present invention.

Referring to FIG. 12, the first contact hole part 131 and the second contact hole part 132 are formed by irradiating (e.g., applying light to) the mask M of FIG. 10 and performing an etching process. The etching may be dry etching.

FIG. 12 is a cross-sectional view corresponding to a surrounding region of the first contact hole part 131 and the second contact hole part 132 when viewed from the top, and the connection part 133 is not formed between the first contact hole part 131 and the second contact hole part 132.

That is, the intensity of light applied to a region corresponding to the surrounding region of the first contact hole part 131 and the second contact hole part 132 is not enough to etch the second insulating layer 103, and as shown in FIG. 12, a portion of the photoresist PR remains on the second insulating layer 103 disposed between the first contact hole part 131 and the second contact hole part 132.

The photoresist PR functions to prevent a phenomenon that sizes of the first contact hole part 131 and the second contact hole part 132 increase in a process of forming the first contact hole part 131 and the second contact hole part 132 by etching.

Thus, according to at least one embodiment of the present invention, a phenomenon that a short with a surrounding conductive layer occurs due to too large sizes of the first contact hole part 131 and the second contact hole part 132 may be prevented.

Referring to FIGS. 13 and 14, after removing the photoresist PR by a stripping process, the connection node 140 which connects the first conductive layer 110 and the second conductive layer 120 is formed.

Thereafter, the third conductive layer 150 (refer to FIG. 5) is formed on the second insulating layer 103 and the connection node 140, and an additional insulating layer which covers the third conductive layer 150 may be further formed.

Figure 15:
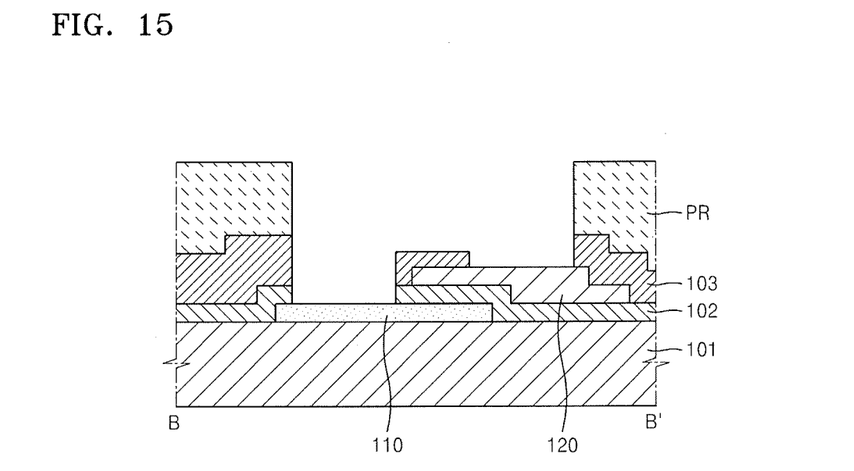
FIGS. 15 to 17 are cross-sectional views of a region corresponding to B-B' of FIG. 4 in a method of manufacturing a display apparatus, according to an exemplary embodiment of the present invention.
Figure 16:
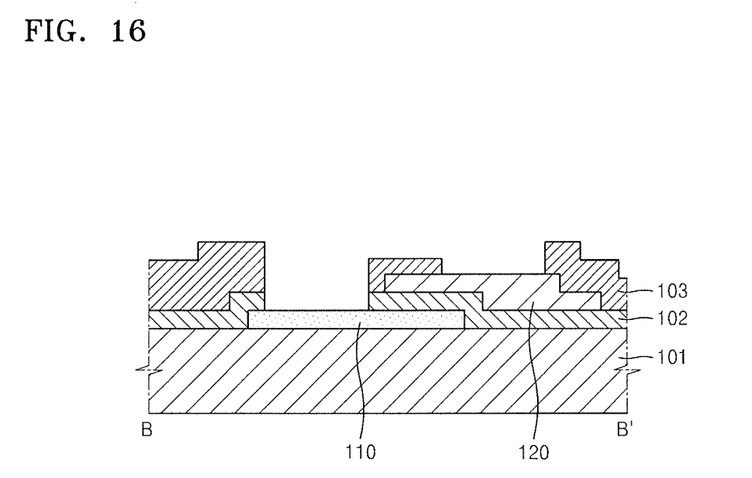
Figure 17:
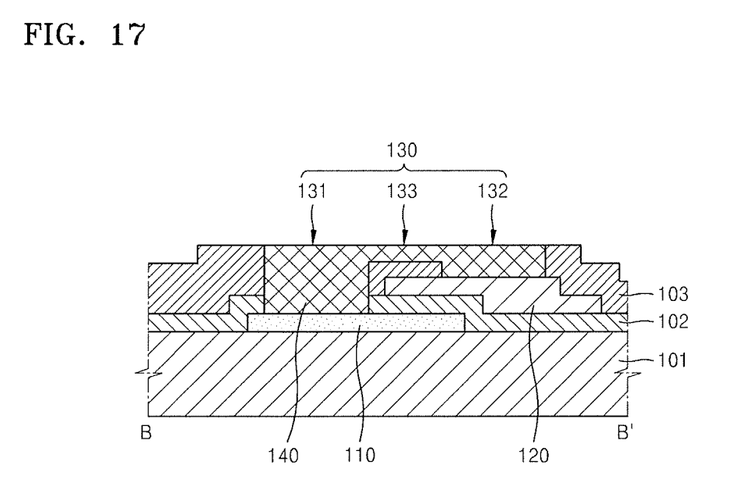

FIGS. 15 to 17 are cross-sectional views of a region corresponding to B-B' of FIG. 4 in the method of manufacturing a display apparatus, according to an exemplary embodiment of the present invention.

Referring to FIG. 15, the first contact hole part 131, the second contact hole part 132, and the connection part 133 are formed by applying light to the mask M of FIG. 10 and performing an etching process.

FIG. 15 is a cross-sectional view corresponding to the central parts of the first contact hole part 131 and the second contact hole part 132 when viewed from the top, and the connection part 133 is formed between the first contact hole part 131 and the second contact hole part 132.

That is, since the intensity of light applied to a region corresponding to the central parts of the first contact hole part 131 and the second contact hole part 132 is enough to etch a portion of the second insulating layer 103, a portion of the second insulating layer 103 is etched to form the connection part 133.

Thus, the node contact hole 130 including the first contact hole part 131, the second contact hole part 132, and the connection part 133 may be formed in a dumbbell shape (e.g., a peanut shape).

Referring to FIGS. 16 and 17, after removing the photoresist PR by a stripping process, the connection node 140 which connects the first conductive layer 110 and the second conductive layer 120 is formed.

Thereafter, the third conductive layer 150 (refer to FIG. 6) is formed on the second insulating layer 103 and the connection node 140, and an additional insulating layer which covers the third conductive layer 150 may be further formed.

According to at least one embodiment of the present invention, a TFT array substrate may have a reduced design margin, a short malfunction between a node contact hole and a metal wiring may be prevented, and a high resolution may be realized by optimizing a distance between a first contact hole part and a second contact hole part included in the node contact hole which electrically connects a first conductive layer and a second conductive layer. At least one embodiment of the invention provides a display apparatus including the TFT array substrate, and a method of manufacturing the TFT array substrate. The display apparatus may have a high resolution.

While one or more embodiments of the present invention have been described with reference to the figures, it will be understood by those of ordinary skill in the art that various changes in form and details may be made therein without departing from the spirit and scope of the present invention.

What is claimed is:

1. A thin-film transistor (TFT) array substrate comprising:
   a first TFT comprising a first active layer, a first gate electrode, a first source electrode, and a first drain electrode;
   a first conductive layer disposed in a same layer as one of the first active layer, the first gate electrode, the first source electrode, and the first drain electrode;
   a second conductive layer disposed in a different layer from the first conductive layer;
   a node contact hole including a first contact hole part which exposes the first conductive layer, a second contact hole part which exposes the second conductive layer, and a connection hole part which connects the first contact hole part and the second contact hole part and has a width that is smaller than a width of the first contact hole part and a width of the second contact hole part; and
   a connection node formed in the node contact hole to electrically connect the first conductive layer and the second conductive layer.

2. The TFT array substrate of claim 1, wherein a length of the connection hole part in a direction extending from the first contact hole part to the second contact hole part is 1.5 μm or less.

3. The TFT array substrate of claim 1, further comprising a first insulating layer disposed between the first conductive layer and the second conductive layer,
   wherein the first conductive layer and the second conductive layer are separated from each other by the first insulating layer in an area in which the conductive layers overlap with one another.

4. The TFT array substrate of claim 1, further comprising a second insulating layer disposed on the second conductive layer,
   wherein a partial region of the second insulating layer is disposed between the first contact hole part and the second contact hole part.

5. The TFT array substrate of claim 4, wherein the connection hole part which connects the first contact hole part and the second contact hole part is disposed on the second insulating layer disposed between the first contact hole part and the second contact hole part.

6. The TFT array substrate of claim 1, further comprising:
   a second TFT comprising a second active layer, a second gate electrode, a second source electrode, and a second drain electrode, and
   wherein the first gate electrode and the second gate electrode are disposed in different layers from each other.

7. The TFT array substrate of claim 6, further comprising a capacitor which comprises a lower electrode disposed in the same layer as the second gate electrode and an upper electrode disposed in the same layer as the first gate electrode,
   wherein the first conductive layer is disposed in the same layer as the first active layer and the second active layer, and
   wherein the second conductive layer is disposed in the same layer as the lower electrode or the upper electrode of the capacitor.

8. A display apparatus comprising a plurality of pixels, wherein each pixel comprises the TFT array substrate of claim 1.

9. The display apparatus of claim 8, wherein the display device is an organic light-emitting device (OLED) comprising a first electrode, a second electrode, and an organic emission layer disposed between the first electrode and the second electrode.

10. A method of manufacturing a thin-film transistor (TFT) array substrate, the method comprising:
    forming a first conductive layer in a same layer as one of an active layer, a gate electrode, a source electrode, and a drain electrode included in a TFT;
    forming a second conductive layer in a different layer from the first conductive layer;
    forming a node contact hole including a first contact hole part which exposes the first conductive layer, a second contact hole part which exposes the second conductive layer, and a connection hole part which connects the first contact hole part and the second contact hole part and has a width that is smaller than a width of the first contact hole part and a width of the second contact hole part; and forming a connection node in the node contact hole to electrically connect the first conductive layer and the second conductive layer.

11. The method of claim 10, wherein the forming of the node contact hole comprises forming the node contact hole by applying light to a mask including a first opening and a second opening respectively corresponding to the first contact hole part and the second contact hole part.

12. The method of claim 11, wherein a spacing distance between the first opening and the second opening included in the mask is 1.5 µm or less.

13. The method of claim 10, further comprising:
    forming a first insulating layer after forming the first conductive layer; and
    forming a second insulating layer after forming the second conductive layer.

14. The method of claim 13, wherein the forming of the node contact hole comprises:
    forming the first contact hole part which exposes the first conductive layer by etching the first insulating layer and the second insulating layer;
    forming the second contact hole part which exposes the second conductive layer by etching the second insulating layer; and
    forming the connection hole part by etching a portion of the second insulating layer which is disposed between the first contact hole part and the second contact hole part.

15. A thin-film transistor (TFT) array substrate comprising:
    a TFT comprising an active layer, a gate electrode, a source electrode, and a drain electrode,
    a first conductive layer disposed in a same layer as one of the active layer, the gate electrode, the source electrode, and the drain electrode;
    a second conductive layer disposed in a different layer from the first conductive layer;
    a first insulating layer comprising first and second insulating parts spaced apart from one another and disposed on the first conductive layer;
    a second insulating layer comprising third, fourth, and fifth insulating parts spaced apart from one another, the third insulating part disposed on the first insulating part, and the fourth and fifth insulating parts disposed on the second insulating part and the second conductive layer; and
    a connection node to electrically connect the first conductive layer and the second conductive layer,
    wherein the second insulating part prevents the conductive layers from contacting one another in an area in which the conductive layers overlap with one another,
    wherein the connection node is located in a hole having first, second, and third sections, the second section located between the first and third sections and having a width smaller than the first and third sections.

16. The TFT array substrate of claim 15, wherein the hole is dumbbell shaped hole.

17. The TFT array substrate of claim 15, wherein the fourth insulating part is located between the third and fifth insulating parts and the connection node surrounds the fourth insulating part.

18. The method of claim 10, further comprises forming an insulating layer on the first conductive layer in an area in which the conductive layers overlap with one another to separate the conductive layers from each other.

* * * * *